(12) United States Patent
Gandhi et al.

(10) Patent No.: US 9,123,700 B2
(45) Date of Patent: Sep. 1, 2015

(54) INTEGRATED CIRCUIT CONSTRUCTIONS HAVING THROUGH SUBSTRATE VIAS AND METHODS OF FORMING INTEGRATED CIRCUIT CONSTRUCTIONS HAVING THROUGH SUBSTRATE VIAS

(75) Inventors: Jaspreet S. Gandhi, Boise, ID (US); Brandon P. Wirz, Kuna, ID (US); Yangyang Sun, Boise, ID (US); Josh D. Woodland, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 254 days.

(21) Appl. No.: 13/345,422

(22) Filed: Jan. 6, 2012

(65) Prior Publication Data

US 2013/0175698 A1    Jul. 11, 2013

(51) Int. Cl.
*H01L 29/40* (2006.01)
*H01L 23/48* (2006.01)
(Continued)

(52) U.S. Cl.
CPC ............ *H01L 23/481* (2013.01); *H01L 21/563* (2013.01); *H01L 23/293* (2013.01); *H01L 24/11* (2013.01); *H01L 24/13* (2013.01); *H01L 24/16* (2013.01); *H01L 24/81* (2013.01); *H01L 25/0657* (2013.01); *H01L 24/29* (2013.01); *H01L 24/32* (2013.01); *H01L 24/73* (2013.01); *H01L 2224/0401* (2013.01); *H01L 2224/0557* (2013.01); *H01L 2224/06181* (2013.01); *H01L 2224/11822* (2013.01);
(Continued)

(58) Field of Classification Search
CPC ................... H01L 2225/06541; H01L 21/486; H01L 21/02063; H01L 2223/6616
USPC ............................ 257/774, E23.011, E21.211
See application file for complete search history.

(56) References Cited

U.S. PATENT DOCUMENTS 6,265,776 B1    7/2001  Gilleo
6,367,150 B1    4/2002  Kirsten
(Continued)

FOREIGN PATENT DOCUMENTS

KR    10-2010-0059123    6/2010
KR    10-2011-0004112    1/2011
(Continued)

OTHER PUBLICATIONS

Chan et al., "Epoxy Flux Technology—Tacky Flux with Value Added Benefits", Henkel Corporation, Electronic Components and Technology Conference, May 26-29, 2009.
(Continued)

*Primary Examiner* — Elias M Ullah
(74) *Attorney, Agent, or Firm* — Wells St. John, P.S.

(57) ABSTRACT

An integrated circuit construction includes a stack of two or more integrated circuit substrates. At least one of the substrates includes through substrate vias (TSVs) individually comprising opposing ends. A conductive bond pad is adjacent one of the ends on one side of the one substrate. A conductive solder mass is adjacent the other end projecting elevationally on the other side of the one substrate. Individual of the solder masses are bonded to a respective bond pad on an immediately adjacent substrate of the stack. Epoxy flux surrounds the individual solder masses. An epoxy material different in composition from the epoxy flux surrounds the epoxy flux on the individual solder masses. Methods of forming integrated circuit constructions are also disclosed.

24 Claims, 4 Drawing Sheets

(51) Int. Cl.
*H01L 23/00* (2006.01)
*H01L 23/29* (2006.01)
*H01L 21/56* (2006.01)
*H01L 25/065* (2006.01)

(52) U.S. Cl.
CPC ............. *H01L 2224/131* (2013.01); *H01L 2224/13025* (2013.01); *H01L 2224/1357* (2013.01); *H01L 2224/1369* (2013.01); *H01L 2224/13082* (2013.01); *H01L 2224/13562* (2013.01); *H01L 2224/14131* (2013.01); *H01L 2224/16058* (2013.01); *H01L 2224/16146* (2013.01); *H01L 2224/17181* (2013.01); *H01L 2224/32145* (2013.01); *H01L 2224/73204* (2013.01); *H01L 2224/81011* (2013.01); *H01L 2224/8123* (2013.01); *H01L 2224/81191* (2013.01); *H01L 2224/81801* (2013.01); *H01L 2224/81862* (2013.01); *H01L 2224/81905* (2013.01); *H01L 2224/83104* (2013.01); *H01L 2924/00014* (2013.01)

(56) References Cited

U.S. PATENT DOCUMENTS

| | | |
|---|---|---|
| 6,615,484 B2 | 9/2003 | Kirsten |
| 6,841,883 B1 | 1/2005 | Farnworth et al. |
| 6,998,717 B2 | 2/2006 | Farnworth et al. |
| 7,060,526 B2 | 6/2006 | Farnworth et al. |
| 7,169,641 B2 | 1/2007 | Shim et al. |
| 7,224,051 B2 | 5/2007 | Farnworth et al. |
| 7,452,747 B2 | 11/2008 | Chan et al. |
| 7,459,393 B2 | 12/2008 | Farnworth et al. |
| 7,498,675 B2 | 3/2009 | Farnworth et al. |
| 7,633,165 B2 | 12/2009 | Hsu et al. |
| 7,683,459 B2 | 3/2010 | Ma et al. |
| 7,863,727 B2 | 1/2011 | Lake |
| 8,183,673 B2 | 5/2012 | Hwang et al. |
| 8,334,170 B2 | 12/2012 | Wang et al. |
| 2002/0095783 A1 | 7/2002 | Kirsten |
| 2003/0096453 A1 | 5/2003 | Wang et al. |
| 2004/0188819 A1 | 9/2004 | Farnworth et al. |
| 2004/0256734 A1 | 12/2004 | Farnworth et al. |
| 2005/0046038 A1 | 3/2005 | Farnworth et al. |
| 2006/0113682 A1 | 6/2006 | Farnworth et al. |
| 2006/0270108 A1 | 11/2006 | Farnworth et al. |
| 2007/0132104 A1* | 6/2007 | Farnworth et al. ............ 257/774 |
| 2008/0303031 A1 | 12/2008 | Toh et al. |
| 2009/0321948 A1 | 12/2009 | Wang et al. |
| 2010/0096753 A1 | 4/2010 | Hwang et al. |
| 2010/0148316 A1 | 6/2010 | Kim et al. |
| 2011/0024888 A1 | 2/2011 | Pagaila et al. |
| 2011/0068444 A1 | 3/2011 | Chi et al. |
| 2011/0128711 A1 | 6/2011 | Yim et al. |
| 2011/0291246 A1 | 12/2011 | Jo et al. |

FOREIGN PATENT DOCUMENTS

| | | |
|---|---|---|
| KR | 10-2011-0131702 | 12/2011 |
| TW | 102100350 | 8/2014 |
| WO | WO PCT/US2012/068741 | 3/2013 |
| WO | WO PCT/US2012/068741 | 7/2014 |

OTHER PUBLICATIONS

Henkel, "Breakthrough Epoxy Flux Technology from Henkel Offers Cost-Effective Single Material Solution for Advanced Package Configurations", Apr. 16, 2008, retrived from http://www.henkelna.com/industrial-news-6128-breakthrough-eposy-flux-techn . . . on Nov. 3, 2011.

Hubbard, "Flip-Chip Process Improvements for Low Warpage", Electronic Components and Technology Conference (ECTC), Jun. 1-4, 2010.

Mackie, "Viewpoint", Semiconductor Packaging News, Jan. 27, 2011, downloaded from http://www.semiconductorpackagingnews.com/articles/article_28999.shtml on Nov. 2, 2011.

Material Safety Data Sheet, "JL8-106-1 Epoxy Flux Formulation", Manufactured by Kester, Printed Nov. 17, 2010, 8 pages.

Todd, "Advancements in Packaging Technology Driven by Global Market Return", Henkel Corporation, China Semiconductor Technology International Conference 2010.

Willis et al., "The Challenges on Package (POP) Devices During Assembly and Inspection", retrieved from http://www.nordson.com/...assembly/.../POP%20paper_SMTA%202009_fi . . . .

Yin et al., "Epoxy Flux—An Answer for Reliable No-Clean Flip Chip Assembly", IEEE, CPMT/SEMI Int'l Electronics Manufacturing Technology Symposium, 2003, pp. 409-415.

* cited by examiner

INTEGRATED CIRCUIT CONSTRUCTIONS HAVING THROUGH SUBSTRATE VIAS AND METHODS OF FORMING INTEGRATED CIRCUIT CONSTRUCTIONS HAVING THROUGH SUBSTRATE VIAS

TECHNICAL FIELD

Embodiments disclosed herein pertain to integrated circuit constructions having through substrate vias, and to methods of forming integrated circuit constructions having through substrate vias.

BACKGROUND

A through-substrate via (TSV) is a vertical electrical connection passing completely through a substrate that has integrated circuitry therein. TSVs may be used to create 3D integrated circuits packages, and are an improvement over other techniques such as package-on-package because the density of through-substrate vias may be substantially higher. TSVs provide interconnection of vertically aligned electronic devices through internal wiring that may reduce complexity and overall dimensions of a multi-chip integrated circuit.

Some individual integrated circuit substrates containing TSVs have a bond pad connected adjacent one end of the TSV on one side of the substrate. A pillar-like conductive structure is connected adjacent the other end and projects from the other side of the substrate, with the elevationally outermost portion thereof being solder. Two integrated circuit substrates may be bonded together by placing that solder against aligned bond pads of another substrate. The resultant construction can then be heated to cause the solder to flow and bond with the respective bond pads. Solder flux may be applied to the solder prior to bringing the substrates into contact with one another. The solder flux contains tackiness agents which facilitate holding the immediately adjacent substrates together until sufficient heating can occur to bond the solder with the bond pads. Once the bonding is complete, a dielectric underfill material may be provided between the substrates for added support and protection.

Residual solder flux may be removed by cleaning prior to flowing the dielectric underfill material between the substrates. Alternately, some solder fluxes are referred to in the industry as "no clean" whereby solder flux residue intentionally remains between the substrates prior to flowing the dielectric underfill material. Regardless, even with attempted cleaning away of solder flux residue prior to dielectric underfill, not all of the residue normally gets removed. Difficulty in removing solder flux in such instances has increased as the separation spacing between immediately adjacent circuit substrates has become smaller.

The construction with dielectric underfill material may be subjected to subsequent heating which can cause gasification of solder flux residue. This can lead to structural failures including separation of the solder bonds from the bond pads. This has become particularly problematic as the spacing between immediately adjacent substrates continues to reduce, specifically at distances of 40 microns or less.

DETAILED DESCRIPTION OF EXAMPLE EMBODIMENTS

Figure 1:
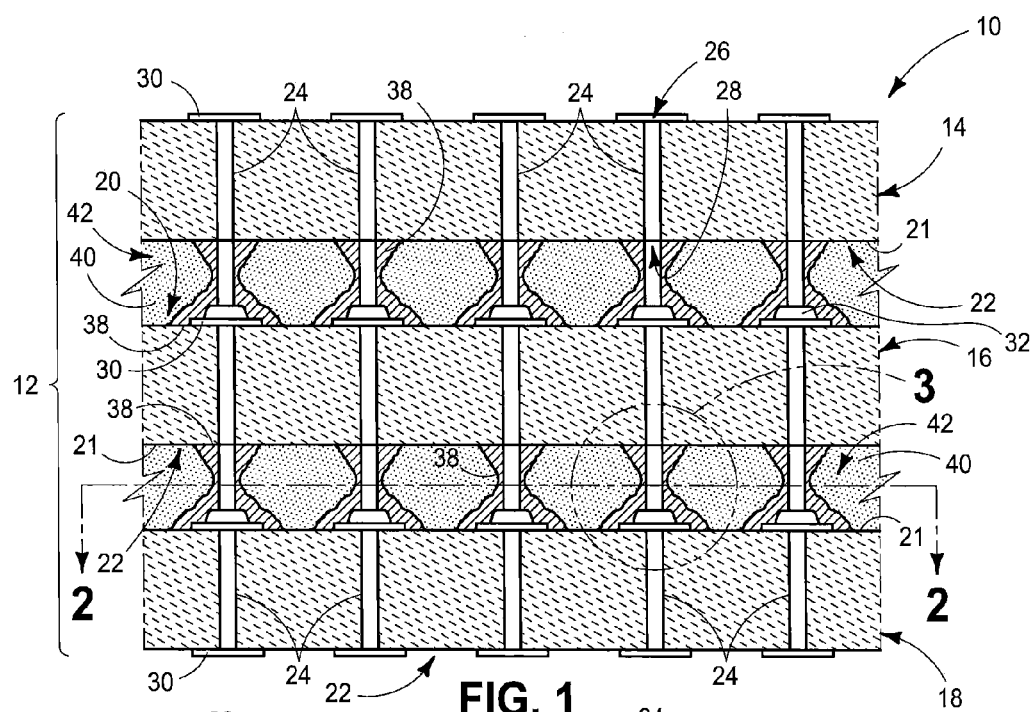
FIG. 1 is a diagrammatic sectional view of an integrated circuit construction in accordance with an embodiment of the invention, and taken through line 1-1 in FIG. 2.

Embodiments of the invention encompass integrated circuit constructions and methods of forming integrated circuit constructions. Initial example embodiments of an integrated circuit construction 10 are described with reference to FIGS. 1-3. Integrated circuit constructions in accordance with the invention comprise a stack of two or more integrated circuit substrates. Example construction 10 comprises a stack 12 of three integrated circuit substrates 14, 16, and 18 which, as an example, may be individual die that have been diced at the completion of fabrication as parts of a semiconductor wafer. Alternate substrates may be used, including combinations of differently fabricated types of substrates bearing circuitry. Substrates 14, 16, 18 may include semiconductor materials (e.g., silicon), dielectric, and conductive materials. Integrated circuit substrates 14, 16, 18 may be considered as having opposing sides 20 and 22 which have respective outer surfaces 21. Such surfaces may or may not be substantially planar and/or parallel one another.

At least one of the integrated circuit substrates comprises TSVs, with each of substrates 14, 16, 18 in the depicted example having TSVs 24. Through-substrate vias have also been referred to in the art as through-silicon vias. In this document, "through-substrate vias" (TSVs) encompass or are generic to through-silicon vias, and TSVs include conductive vias extending through substrate material regardless of whether any of that material is silicon. TSVs 24 may comprise any one or more suitable conductive materials, including conductively doped semiconductor material(s), which are not germane to this disclosure.

Figure 3:
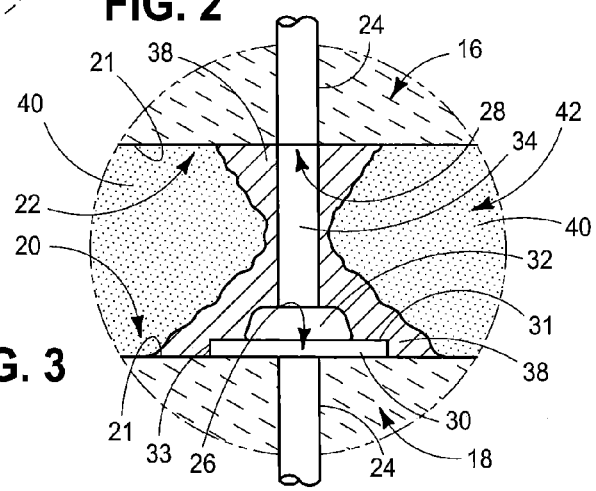
FIG. 3 is an enlarged view of a portion of the FIG. 1 substrate, namely an enlarged view of the portion within circle 3 in FIG. 1.

TSVs 24 individually comprise opposing ends 26 and 28. With respect to integrated circuit substrates 14 and 16, TSVs 24 include a conductive bond pad 30 adjacent TSV end 26 on substrate side 20. In one embodiment and as shown, bond pads 30 are raised relative to outer surfaces 21 of substrates 14, 16, 18. For example, bond pads 30 have an elevationally outermost surface 31 and surrounding lateral side surfaces 33 (FIG. 3). A conductive solder mass 32 is adjacent other TSV end 28 and projects elevationally on other side 22 of integrated circuit substrates 14 and 16. In one embodiment and as shown, a conductive material 34 is between individual TSVs 24 and individual solder masses 32. As an alternate example, solder masses 32 might be bonded directly against (not shown) ends 28 of TSVs 24. In this document, a material or structure is "directly against" another when there is at least some physical touching contact of the stated materials or structures relative one another. In contrast, "over", "on", and "against" not proceeded by "directly", encompass "directly against" as well as constructions where intervening material(s) or structure(s) result(s) in no physical touching contact of the stated materials or structures relative one another.

Each of conductive material 34 and solder masses 32 may be homogenous or non-homogenous, and may be of any suitable conductive materials not otherwise germane to this disclosure. Regardless, when used, conductive material 34 includes some portion that is directly against the individual solder masses that is of different composition than the individual solder masses. Conductive material 34 and solder masses 32 may be considered as forming conductive pillars which project elevationally on substrate sides 22 of integrated circuit substrates 14 and 16.

Example integrated circuit substrate 18 comprises bond pads 30 adjacent both ends of TSVs 24. As an example, integrated circuit construction or package 10 may ultimately have bond pads 30 on side 22 of substrate 18 bonded by wires or other conductors when mounted to another substrate, for example a printed circuit board. Regardless, integrated circuit constructions in accordance with embodiments of the invention comprise a stack of at least two integrated circuit substrates at least one of which has TSVs having a bond pad adjacent one end thereof and a solder mass adjacent the other end thereof, for example as shown with either of substrates 14 and 16.

Individual of the solder masses are bonded to a respective bond pad on an immediately adjacent substrate of the stack. For convenience, the discussion proceeds primarily with reference to circuit substrates 16 and 18 of stack 12, although like structure may exist and is shown with respect to substrates 14 and 16. Solder masses 32 may be considered as being associated with substrate 16 and are bonded to bond pads 30 of immediately adjacent substrate 18 of stack 12.

Epoxy solder flux 38 surrounds individual solder masses 32. An epoxy material 40 different in composition from epoxy flux 38 surrounds the epoxy flux 38 that is on individual solder masses 32. Each of epoxy flux 38 and dielectric fill material 40 may be independently homogenous or non-homogenous. An example lateral thickness range of epoxy flux 38 is from about 5 microns to about 30 microns. Epoxy flux 38 may be of variable lateral thickness, for example as shown. Epoxy flux surrounding immediately adjacent solder masses 32 and/or immediately adjacent conductive material 34 structures may interconnect with one another between such adjacent masses and/or structures (not shown). Additionally, an interface of the epoxy flux with the epoxy material will more likely constitute a blend of the two different materials (not explicitly shown) as opposed to the hard-defined interface line which is shown as separating epoxy flux 38 and epoxy material 40. Accordingly, reference to thickness is relative to a lateral midpoint of a more-likely blended interface region between the different composition epoxy flux 38 and epoxy material 40. Example suitable precursors for epoxy flux 38 and epoxy material 40 (i.e., underfill material) are available from the Henkel Corporation of Irvine, Calif.

In one embodiment and as shown, epoxy flux 38 extends from substrate 16 to immediately adjacent substrate 18 (i.e., epoxy flux 38 is directly against at least some portion of each substrate 16 and 18, with individual bond pads being considered as a portion of some one substrate). Alternately, the epoxy flux may extend elevationally to only one (not shown) or neither (not shown) of substrates 16 and 18. The epoxy flux may be received continuously or discontinuously about solder masses 32, and analogously may extend continuously or discontinuously elevationally relative to solder masses 32. The epoxy flux may extend continuously or discontinuously relative to conductive material 34 when such is present and the epoxy flux is received laterally thereover.

In one embodiment, epoxy material 40 extends from substrate 16 to immediately adjacent substrate 18 (i.e., epoxy material 40 is directly against each substrate 16 and 18). Alternately, epoxy material 40 may only extend to one (not shown) or neither (not shown) of substrates 16 and 18. In one embodiment and as shown, integrated circuit substrates 16 and 18 define a void space 42 there-between which is laterally outward of epoxy flux 38. In one embodiment and as shown, epoxy material 40 completely fills void space 42.

In one embodiment, epoxy flux 38 is directly against the solder masses 32, and in one embodiment epoxy material 40 is directly against epoxy flux 38. In one embodiment where epoxy flux 38 extends to immediately adjacent substrate 18 and as shown, epoxy flux 38 may be directly against surrounding lateral side surfaces 33 of individual bond pads 30, and in one embodiment directly against elevationally outermost surface 31 of individual bond pads 30. Where conductive material 34 is present, in one embodiment epoxy flux 38 may also surround conductive material 34 and in one embodiment may be directly against conductive material 34.

In one embodiment, closest portions of facing outer surfaces 21 of substrate 16 and immediately adjacent substrate 18 are no further than 40 microns apart. In one embodiment, facing outer surfaces 21 are everywhere no further than 40 microns apart.

Use of epoxy flux and other epoxy material laterally outward of the epoxy flux may provide improved compatibility between flux and fill material compared to prior art methods which use epoxy fill material and solder flux other than epoxy solder flux. Further, use of epoxy flux may produce reduced, if any, residual volatile components upon subsequent heating due to substantially complete cross-linking, and thereby may produce more reliable finished integrated circuitry package constructions. Additionally, use of epoxy flux may reduce residue volume in comparison with no clean fluxes which may improve flow of epoxy underfill materials into tight spaces. Further, the residue itself from pre-cured epoxy flux ultimately forms a cured epoxy which may have very good compatibility with epoxy underfill material. Additionally, epoxy flux may provide increased tackiness during package assembly as compared to other non-epoxy fluxes.

Figure 2:
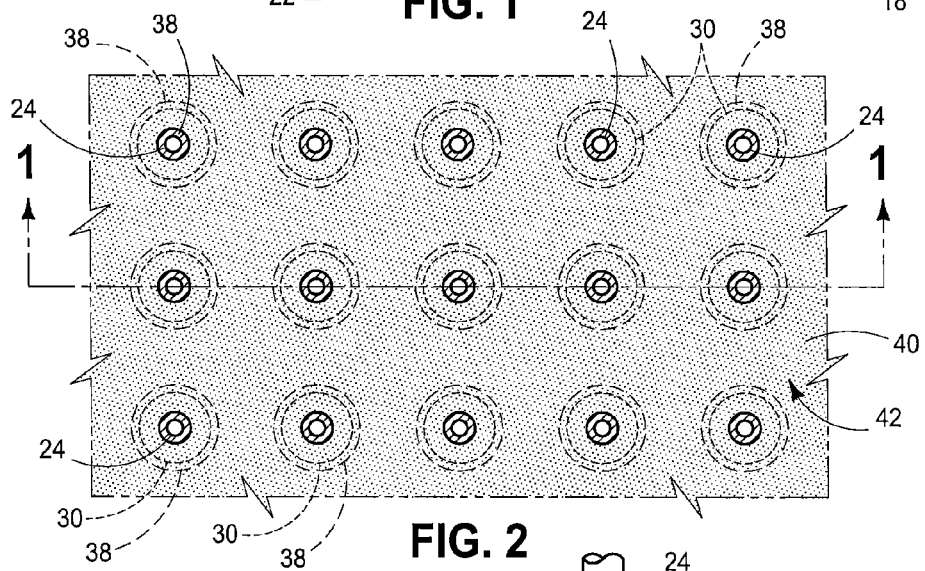
FIG. 2 is a sectional view of the FIG. 1 substrate taken through line 2-2 in FIG. 1.
Figure 4:
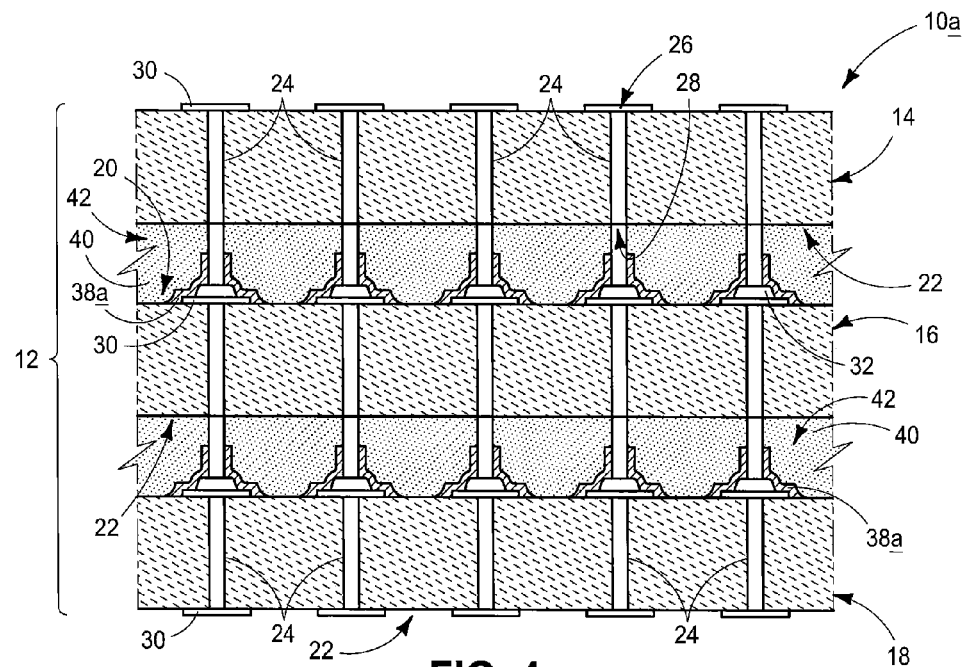
FIG. 4 is a diagrammatic sectional view of an integrated circuit construction in accordance with an embodiment of the invention, and an alternate of the construction shown in FIG. 1.

Integrated circuit construction 10 of FIGS. 1-3 is an example embodiment wherein epoxy flux 38 extends from circuit substrate 16 to circuit substrate 18. FIG. 4 shows an example alternate integrated circuit construction 10a wherein epoxy flux 38a does not extend from circuit substrate 16 to circuit substrate 18. Like numerals from the above-described embodiments have been used where appropriate, with some construction differences being indicated with the suffix "a". Integrated circuit construction 10a of FIG. 4 shows an example, with respect to substrates 16, 18, wherein an epoxy flux 38a extends to immediately adjacent substrate 18 but not to substrate 16. Alternately, with respect to substrates 16, 18 and by way of example, the epoxy flux may extend to circuit substrate 16 and not to circuit substrate 18 (not shown).

The various relationships described above with respect to two immediately adjacent substrates within a stack may or may not apply with respect to some and/or all other immediately adjacent integrated circuit substrate pairs in the stack.

Figure 5:
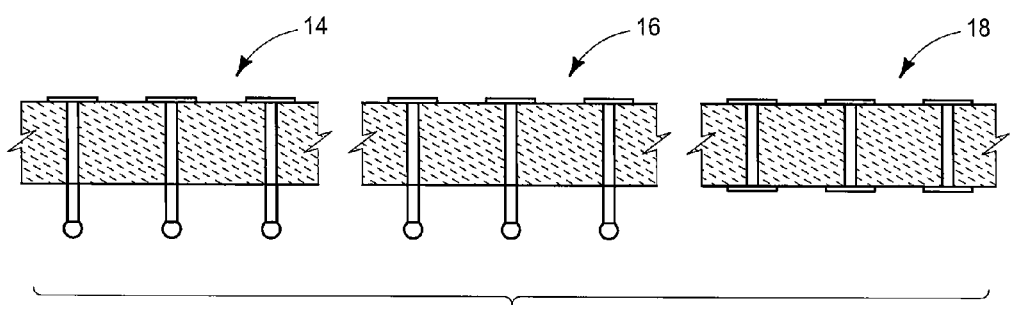
FIG. 5 is a diagrammatic view of separate integrated circuit substrates prepared for use in a method of forming an integrated circuit construction in accordance with an embodiment of the invention.

Embodiments of the invention also encompass methods of forming an integrated circuit construction, for example either of the constructions of FIGS. 1-4 or other integrated circuit constructions. Method embodiments of the invention encompass providing two or more circuit substrates, where at least one of the substrate comprises TSVs which individually comprise opposing ends. A conductive bond pad is adjacent one of the ends on one side of the one substrate and a conductive solder mass is adjacent the other end projecting elevationally on the other side of the one substrate. For example, FIG. 5 shows integrated circuit substrates 14, 16, and 18 prior to assembly into an integrated circuit construction, for example a unitary circuit construction.

Figure 6:
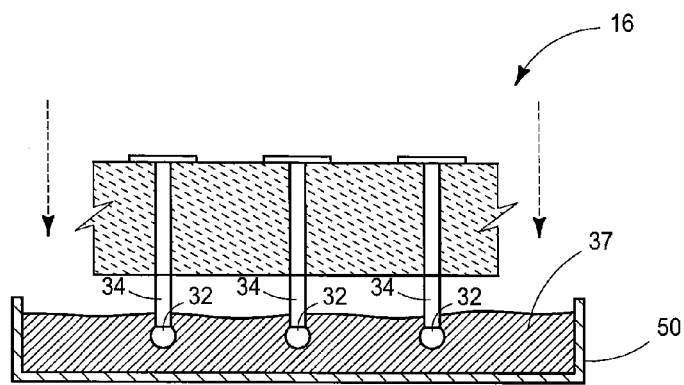
FIG. 6 is a diagrammatic view of an example process step in a method of forming an integrated circuit construction in accordance with an embodiment of the invention.

Pre-cured epoxy flux (i.e., not-yet-cured epoxy flux precursor(s)) is applied onto the solder masses. FIG. 6 shows one example embodiment wherein a pre-cured epoxy flux 37 is provided within a suitable tray or container 50. Circuit substrate 16 has been positioned such that its solder masses 32 are dipped into pre-cured epoxy flux 37. The pre-cured epoxy flux may completely or partially cover solder masses 32. Further where conductive material 34 is present, the pre-cured epoxy flux may cover some, none, or all of conductive material 34.

Figure 7:
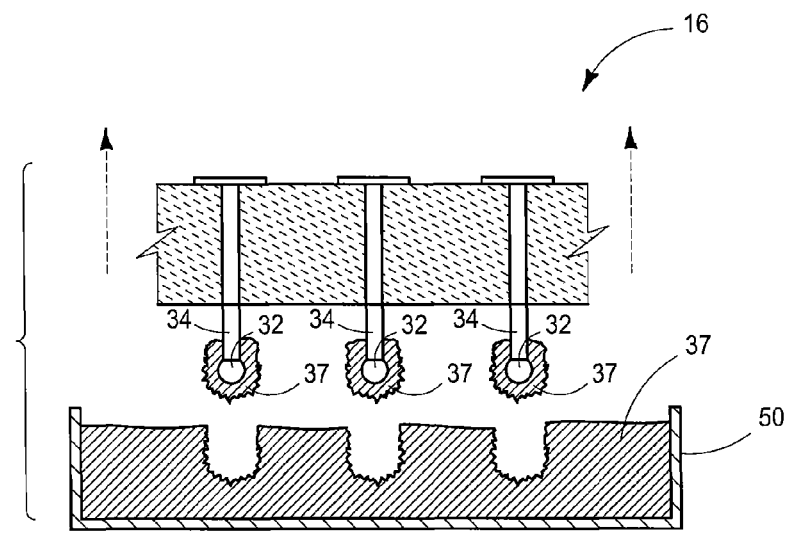
FIG. 7 is a view of the components of FIG. 6 at a processing step subsequent to that shown by FIG. 6.

FIG. 7 shows removal of circuit substrate 16 from pre-cured epoxy flux 37 and container 50, with epoxy flux 37 being received on solder masses 32.

Figure 8:
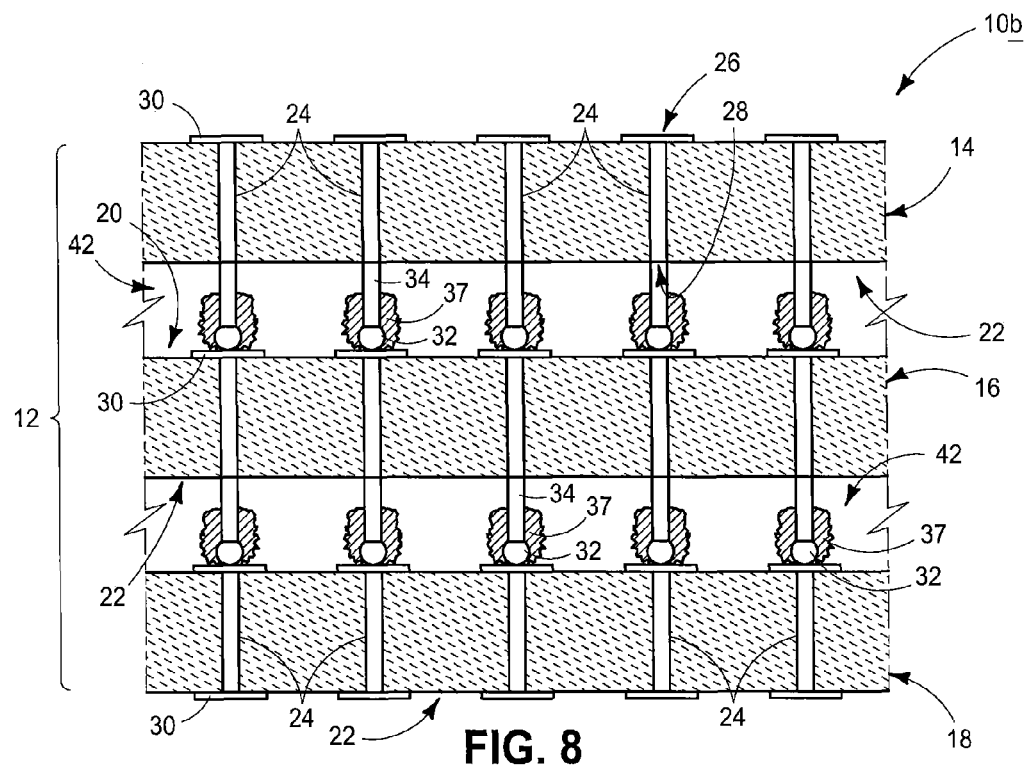
FIG. 8 is a view of some of the components of FIGS. 5-7 at a processing step subsequent to that shown by FIGS. 6 and 7.

The one substrate is placed against another of the substrates, with individual of the solder masses having pre-cured epoxy flux thereon being against respective bond pads of the other substrate. For example, FIG. 8 shows example juxtaposition of substrates 14, 16, 18 relative one another. The pre-cured epoxy flux ideally has suitable inherent tackiness or tackiness additives allowing the structure of FIG. 8, for example, to retain sufficient structural integrity for holding substrates 14, 16, 18 in position relative one another as shown.

Figure 9:
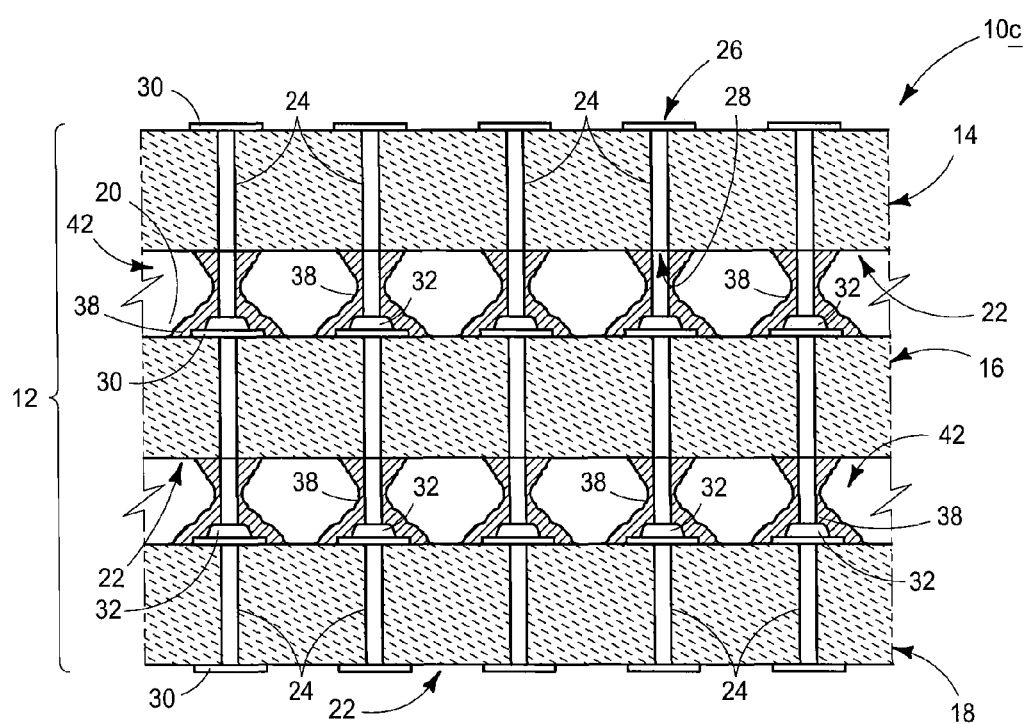
FIG. 9 is a view of the components of FIG. 8 at a processing step subsequent to that shown by FIG. 8.

The solder masses are heated sufficiently to cause them to bond to the respective bond pads and to cure the pre-cured epoxy flux into cured epoxy flux 38 surrounding individual of the solder masses, for example as shown with respect to FIG. 9. By way of example only, the construction of FIG. 8 may be subjected to suitable infrared radiation to achieve an example assembly temperature range of from about 240° C. to about 260° C. to cause solder bonding to the bond pads and curing of the epoxy flux. The epoxy flux may flow to extend about more or all of conductive structures 34 when present, as is shown. The epoxy flux is subsequently surrounded with epoxy material that is different in composition from the epoxy flux, for example to produce the construction of FIGS. 1-3 or other construction.

Conclusion

In some embodiments, an integrated circuit construction comprises a stack of two or more integrated circuit substrates, at least one of the substrates comprises through substrate vias (TSVs) individually comprising opposing ends. A conductive bond pad is adjacent one of the ends on one side of the one substrate. A conductive solder mass is adjacent the other end projecting elevationally on the other side of the one substrate. Individual of the solder masses are bonded to a respective bond pad on an immediately adjacent substrate of the stack. Epoxy flux surrounds the individual solder masses. An epoxy material different in composition from the epoxy flux surrounds the epoxy flux on the individual solder masses.

In some embodiments, an integrated circuit construction comprises a stack of two or more integrated circuit substrates. At least one of the substrates comprises through substrate vias (TSVs) individually comprising opposing ends. A conductive bond pad is adjacent one of the ends on one side of the one substrate and a conductive solder mass is adjacent the other end projecting elevationally on the other side of the one substrate. A conductive material is between the individual TSVs and the individual solder masses. The conductive material includes a portion that is directly against the individual solder masses. The portion is of different composition than the individual solder masses. The individual solder masses are bonded to a respective bond pad on an immediately adjacent substrate of the stack. Epoxy flux surrounds the individual solder masses and the conductive material. The epoxy flux extends from the one substrate to the immediately adjacent substrate. An epoxy material different in composition from the epoxy flux surrounds the epoxy flux on the conductive material and the individual solder masses. The epoxy material is directly against the epoxy flux and extends from the one substrate to the immediately adjacent substrate. The epoxy material completely fills a void space which is laterally outward of the epoxy flux between the one substrate and the immediately adjacent substrate. The one substrate and the immediately adjacent substrate have closest portions of facing outer surfaces that are no further than 40 microns apart.

In some embodiments, a method of forming an integrated circuit construction comprises providing two or more integrated circuit substrates. At least one of the substrates comprises through substrate vias (TSVs) individually comprising opposing ends. A conductive bond pad is adjacent one of the ends on one side of the one substrate. A conductive solder mass is adjacent the other end projecting elevationally on the other side of the one substrate. Pre-cured epoxy flux is applied onto the solder masses. The one substrate is placed against another of the substrates with individual of the solder masses having the pre-cured epoxy flux thereon being against respective bond pads of the another substrate. The solder masses are heated sufficiently to cause them to bond to the respective bond pads and to cure the pre-cured epoxy flux into cured epoxy flux surrounding individual of the solder masses. The cured epoxy flux that surrounds the individual solder masses is surrounded with an epoxy material that is different in composition from the epoxy flux.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An integrated circuit construction, comprising: a stack of two or more integrated circuit substrates, at least one of the substrates comprising through substrate vias (TSVs) individually comprising opposing ends, a conductive bond pad adjacent one of the ends on one side of the one substrate and a conductive solder mass adjacent the other end projecting elevationally on the other side of the one substrate;

individual of the solder masses being bonded to a respective bond pad on an immediately adjacent substrate of the stack;

epoxy solder flux surrounding the individual solder masses; and an epoxy material different in composition from the epoxy solder flux surrounding the epoxy solder flux on the individual solder masses.

2. The integrated circuit construction of claim 1 wherein solder the epoxy solder flux extends to the immediately adjacent substrate.

3. The integrated circuit construction of claim 2 wherein, the bond pads are raised relative to an outer surface of the immediately adjacent substrate, the respective bond pads having an elevationally outermost surface and surrounding lateral side surfaces; and the epoxy solder flux being directly against the surrounding lateral side surfaces of the individual bond pads.

4. The integrated circuit construction of claim 3 wherein the epoxy solder flux is directly against the elevationally outermost surface of the individual bond pads.

5. The integrated circuit construction of claim 1 wherein the epoxy solder flux extends from the one substrate to the immediately adjacent substrate.

6. The integrated circuit construction of claim 1 wherein the epoxy material extends from the one substrate to the immediately adjacent substrate.

7. The integrated circuit construction of claim 1 wherein the epoxy solder flux and the epoxy material extend from the one substrate to the immediately adjacent substrate.

8. The integrated circuit construction of claim 1 wherein the epoxy solder flux is directly against the solder masses.

9. The method of claim 8 comprising a conductive material between the individual TSVs and the individual solder masses, the conductive material including a portion that is directly against the individual solder masses, the portion being of different composition than the individual solder masses, the epoxy solder flux being directly against the conductive material.

10. The integrated circuit construction of claim 1 wherein the epoxy material is directly against the epoxy solder flux.

11. The integrated circuit construction of claim 1 wherein the epoxy solder flux is directly against the solder masses and the epoxy material is directly against the epoxy solder flux.

12. The integrated circuit construction of claim 1 wherein the epoxy material completely fills a void space which is laterally outward of the epoxy solder flux between the one substrate and the immediately adjacent substrate.

13. The integrated circuit construction of claim 1 wherein the epoxy solder flux does not extend from the one substrate to the immediately adjacent substrate.

14. The integrated circuit construction of claim 13 wherein the epoxy solder flux extends to the immediately adjacent substrate.

15. The integrated circuit construction of claim 13 comprising a conductive material between the individual TSVs and the individual solder masses, the conductive material including a portion that is directly against the individual solder masses, the portion being of different composition than the individual solder masses, the epoxy solder flux being directly against the conductive material.

16. The integrated circuit construction of claim 1 wherein the one substrate and the immediately adjacent substrate have closest portions of facing outer surfaces that are no further than 40 microns apart.

17. The integrated circuit construction of claim 1 wherein the one substrate and the immediately adjacent substrate have facing outer surfaces that are everywhere no further than 40 microns apart.

18. The integrated circuit construction of claim 1 wherein the stack comprises more than two integrated circuit substrates individually comprising TSVs.

19. The An integrated circuit construction, comprising: a stack of two or more integrated circuit substrates, at least one of the substrates comprising through substrate vias (TSVs) individually comprising opposing ends, a conductive bond pad adjacent one of the ends on one side of the one substrate and a conductive solder mass adjacent the other end projecting elevationally on the other side of the one substrate, a conductive material between the individual TSVs and the individual solder masses, the conductive material including a portion that is directly against the individual solder masses, the portion being of different composition than the individual solder masses;

the individual solder masses being bonded to a respective bond pad on an immediately adjacent substrate of the stack;

epoxy solder flux surrounding the individual solder masses and the conductive material, the epoxy solder flux extending from the one substrate to the immediately adjacent substrate; and an epoxy solder material different in composition from the epoxy solder flux surrounding the epoxy solder flux on the conductive material and the individual solder masses, the epoxy material being directly against the epoxy solder flux and extending from the one substrate to the immediately adjacent substrate, the epoxy material completely filling a void space which is laterally outward of the epoxy solder flux between the one substrate and the immediately adjacent substrate, the one substrate and the immediately adjacent substrate have closest portions of facing outer surfaces that are no further than 40 microns apart.

20. The integrated circuit construction of claim 19 wherein, the bond pads are raised relative to an outer surface of the immediately adjacent substrate, the respective bond pads having an elevationally outermost surface and surrounding lateral side surfaces; and the epoxy solder flux being directly against the surrounding lateral side surfaces of the individual bond pads.

21. The integrated circuit construction of claim 19 wherein the epoxy solder flux is directly against the solder masses.

22. An integrated circuit construction, comprising:
a stack of two or more integrated circuit substrates, at least one of the substrates comprising through substrate vias (TSVs) individually comprising opposing ends, a conductive bond pad adjacent one of the ends on one side of the one substrate and a conductive solder mass adjacent the other end projecting elevationally on the other side of the one substrate;

individual of the solder masses being bonded to a respective bond pad on an immediately adjacent substrate of the stack;

epoxy solder flux surrounding the individual solder masses and which is elevationally between two immediately adjacent substrates of the stack;

an epoxy material different in composition from the epoxy solder flux surrounding the epoxy solder flux on the individual solder masses, the epoxy material being elevationally between said two immediately adjacent substrates of the stack, the epoxy material being directly against opposing and facing outer surfaces of said two immediately adjacent substrates of the stack.

23. The integrated circuit construction of claim 22 wherein the epoxy solder flux is directly against the solder masses.

24. The method of claim 23 comprising a conductive material between the individual TSVs and the individual solder masses, the conductive material including a portion that is directly against the individual solder masses, the portion being of different composition than the individual solder masses, the epoxy solder flux being directly against the conductive material.

* * * * *

UNITED STATES PATENT AND TRADEMARK OFFICE
CERTIFICATE OF CORRECTION

| | | |
|---|---|---|
| PATENT NO. | : 9,123,700 B2 | Page 1 of 1 |
| APPLICATION NO. | : 13/345422 | |
| DATED | : September 1, 2015 | |
| INVENTOR(S) | : Gandhi et al. | |

It is certified that error appears in the above-identified patent and that said Letters Patent is hereby corrected as shown below:

In the Claims

Col. 6, line 66, claim 2, please delete "solder" before "the epoxy".

Col. 7, line 62, claim 19, please delete "The" before "An integrated circuit".

Col. 8, line 49, claim 22, please insert --and-- after "of the stack".

Signed and Sealed this
Twelfth Day of January, 2016

Michelle K. Lee
*Director of the United States Patent and Trademark Office*